(12) United States Patent
Shibatani et al.

(10) Patent No.: US 8,274,197 B2
(45) Date of Patent: Sep. 25, 2012

(54) DRIVING DEVICE

(75) Inventors: Kazuhiro Shibatani, Sakai (JP); Manji Takano, Amagasaki (JP)

(73) Assignee: Konica Minolta Opto, Inc., Tokyo (JP)

( * ) Notice: Subject to any disclaimer, the term of this patent is extended or adjusted under 35 U.S.C. 154(b) by 283 days.

(21) Appl. No.: 12/768,170

(22) Filed: Apr. 27, 2010

(65) Prior Publication Data

US 2010/0277039 A1  Nov. 4, 2010

(30) Foreign Application Priority Data

Apr. 30, 2009  (JP) ................................. 2009-110945

(51) Int. Cl.
    *H01L 41/09* (2006.01)
(52) U.S. Cl. ......... 310/317; 310/328; 310/330; 310/331
(58) Field of Classification Search .................. 310/317, 310/328, 330, 331
    See application file for complete search history.

(56) References Cited

U.S. PATENT DOCUMENTS

| | | | |
|---|---|---|---|
| 7,213,681 B2 * | 5/2007 | Birchak et al. ................. | 181/121 |
| 7,512,327 B2 * | 3/2009 | Sakata ............................ | 396/52 |
| 7,633,211 B2 * | 12/2009 | Sasaki ........................... | 310/328 |
| 7,671,514 B2 * | 3/2010 | Lee et al. ....................... | 310/328 |
| 2001/0026112 A1 * | 10/2001 | Yoshida et al. ................ | 310/328 |
| 2002/0036445 A1 * | 3/2002 | Iino et al. ................. | 310/323.16 |
| 2002/0084719 A1 * | 7/2002 | Okamoto et al. ............. | 310/328 |
| 2002/0175597 A1 * | 11/2002 | Raman et al. ................. | 310/328 |
| 2004/0013420 A1 * | 1/2004 | Hara ............................... | 396/55 |
| 2004/0017134 A1 * | 1/2004 | Ganor ............................ | 310/328 |
| 2004/0080243 A1 * | 4/2004 | Miyazawa ..................... | 310/328 |
| 2004/0251778 A1 * | 12/2004 | Hoshino ........................ | 310/317 |
| 2005/0232094 A1 * | 10/2005 | Hoshino .................... | 369/44.11 |
| 2005/0248234 A1 * | 11/2005 | Hoshino ........................ | 310/328 |
| 2006/0113865 A1 * | 6/2006 | Yoshida ........................ | 310/317 |
| 2008/0252173 A1 * | 10/2008 | Yoshida et al. ............... | 310/317 |
| 2010/0026139 A1 * | 2/2010 | Yoshida ........................ | 310/317 |
| 2010/0296184 A1 * | 11/2010 | Shibatani ...................... | 359/824 |

FOREIGN PATENT DOCUMENTS

| | | |
|---|---|---|
| JP | 2000-078861 | 3/2000 |
| JP | 2005-305353 A * | 4/2004 |
| JP | 2007-325466 | 12/2007 |
| JP | 2008-172885 | 7/2008 |
| JP | 2008-178209 | 7/2008 |

\* cited by examiner

*Primary Examiner* — Thomas Dougherty
(74) *Attorney, Agent, or Firm* — Brinks Hofer Gilson & Lione

(57) ABSTRACT

A driving device capable of multidimensional positioning by the single device has a shaft-like driving member 4, an electromechanical transducer 3 which has a plurality of expandable portions 11, 12 and which holds one end of the driving member 4, the expandable portions being provided in parallel so that each of the expandable portions can separately expands and contracts in a axial direction of the driving member 4, and a movable member 5 which frictionally engages on the driving member 4 and which can displace slidingly on the driving member 4, and a drive circuit which applies to some of the expandable portions 11, 12 a low change rate of direct-current voltage component different from that applied to other expandable portions 11, 12, and which applies to all the expandable portions 11, 12 a common alternating voltage component fluctuating with a common period.

5 Claims, 6 Drawing Sheets

DRIVING DEVICE

This application is based on application No. 2009-110945 filed in Japan, the contents of which are hereby incorporated by reference.

TECHNICAL FIELD

The present invention relates to a driving device.

BACKGROUND ART

As disclosed in JP 2000-78861 A, there are publicly known driving devices of vibration type which cause asymmetrical vibrations of a driving member and slide displacement of a movable member engaged frictionally with the driving member.

As disclosed in JP 2008-178209 A, JP 2008-172885 A and JP 2007-325466 A, there are also known driving devices (truss actuators) which frictionally drive a movable member held movably by guides or the like, using contact members which make elliptical motions through agency of a plurality of piezoelectric elements.

In JP 2000-78861 A, JP 2008-178209 A, JP 2008-172885 A and JP 2007-325466 A are disclosed techniques for achieving a two-dimensional motion using a rotary motion through agency of a piezoelectric element in which a plurality of piezoelectric elements are integrally formed, in other words, in which electrodes are separately provided so that different portions of the one piezoelectric element can separately be expanded and contracted.

SUMMARY OF INVENTION

Any of the driving devices described in the above mentioned Japanese patent literatures capable of performing only one-dimensional driving, and it is thus necessary to combine two or more driving devices or three or more driving devices in order to attain two-dimensional driving or three-dimensional driving, respectively.

An object of the present invention is to provide a driving device capable of achieving multidimensional positioning by the single device.

In order to achieve the objects of the present invention, there is provided a driving device comprising a shaft-like driving member, an electromechanical transducer which has a plurality of expandable portions and which holds one end of the driving member, the expandable portions being provided in parallel so that each of the expandable portions can separately be expanded and contracted in an axial direction of the driving member and can independently be controlled, and a movable member which is frictionally engaged on the driving member and which can be displaced slidingly on the driving member.

According to this configuration, expansion and contraction of the electromechanical transducer with a short period cause vibrations of the driving member and the slide displacement of the movable member in the direction of the axis of the driving member, and imbalanced slow expansion and contraction of the expandable portions cause an inclination of the driving member while retaining the engagement of the movable member. That is, a moving radius of the movable member in a polar coordinate system is determined by a position thereof in the direction of the axis of the driving member and an argument (azimuth angle) θ of the movable member in the polar coordinate system is determined by the inclination of the driving member. Thus multidimensional positioning can be attained by the single driving device of the present invention.

In the driving device of the present invention, a number of the expandable portions may be not less than three.

According to this configuration, three-dimensional positioning can be attained because the driving member can be inclined in any of three or more directions and because the arguments in two or more directions can be determined.

The driving device of the present invention may further have a drive circuit which applies to some of the expandable portions a direct-current voltage component different from that applied to other expandable portions, and which applies to all the expandable portions a common alternating voltage component periodically fluctuating, wherein the direct-current voltage component can be varied in voltage at a low change rate so as to prevent the slide displacement of the movable member.

According to this configuration, the driving member can be inclined by the direct-current voltage component and the slide displacement of the movable member on the driving member can be caused by the alternating voltage component.

In the driving device of the present invention, an even number of the expandable portions may be provided around a center axis of the electromechanical transducer which extends in the direction of the axis of the driving member, and the drive circuit may apply the direct-current voltage component opposite in polarity to the expandable portions facing across the center axis.

According to this configuration, the inclination of the driving member can be increased by expansion of one of the facing expandable portions and contraction of the other.

In the driving device of the present invention, no direct-current voltage component may be applied to at least any of the expandable portions.

According to this configuration, lack of forces for the expansion and contraction in some of the expandable portions makes it possible to adjust a direction in which the forces for the expansion and contraction of the electromechanical transducer are balanced and to widen choices for the direction of inclination of the driving member.

According to the invention, the slide displacement of the movable member on the driving member can be caused by uniform expansion and contraction of the plurality of expandable portions of the electromechanical transducer with a short period and the driving member can be inclined by nonuniform slow expansion and contraction of the expandable portions. Thus multidimensional positioning of the movable member in the polar coordinate system can be attained.

BRIEF DESCRIPTION OF DRAWINGS

These and other objects and features of the present invention will become apparent from the following description taken in conjunction with the preferred embodiments thereof with reference to the accompanying drawings, in which.

DESCRIPTION OF EMBODIMENTS

Figure 1:
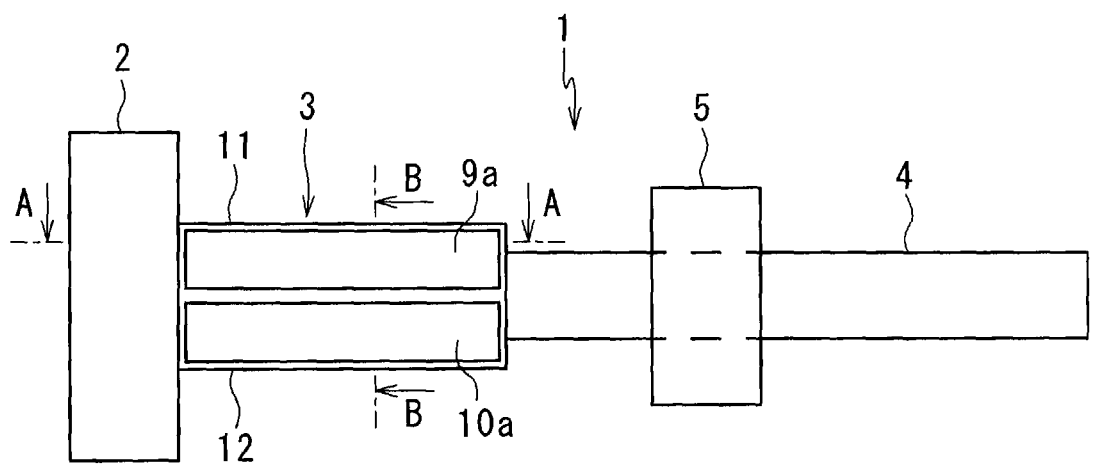
FIG. 1 is a side view of a driving device of a first embodiment of the present invention.
Figure 2:
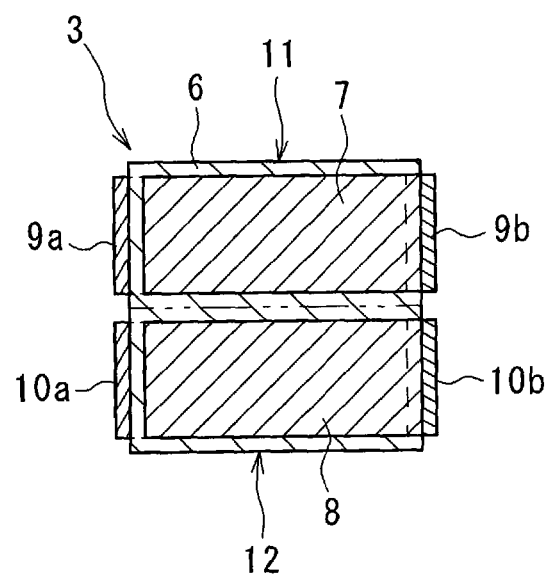
FIG. 2 is a view of a cross-section of the driving device of FIG. 1, taken along line A-A.
Figure 3:
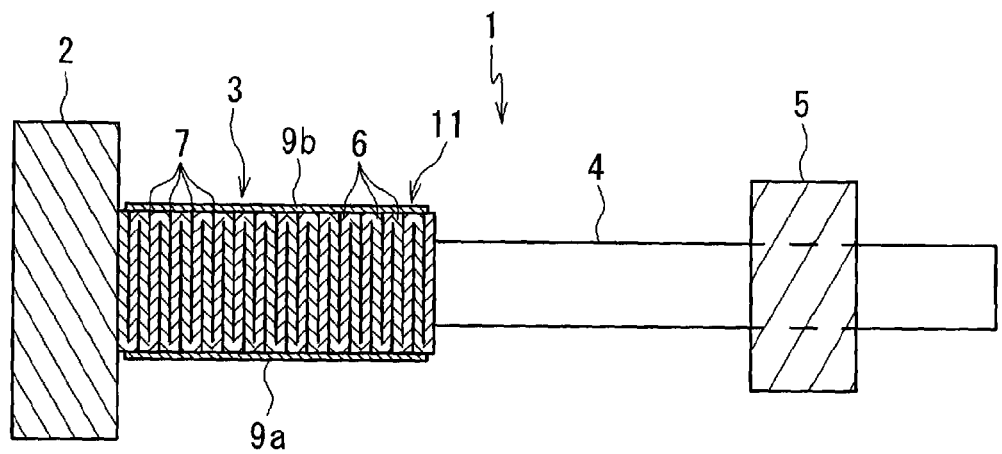
FIG. 3 is a view of a cross-section of the driving device of FIG. 1, taken along line B-B.

Hereinbelow, embodiments of the present invention will be described with reference to the drawings. FIGS. 1 through 3 show a driving device 1 of a first embodiment of the present invention. The driving device 1 comprises of a weight 2, a piezoelectric element (electromechanical transducer) 3 having one end fixed to the weight 2, a shaft-like driving member 4 having one end fixed to the other end of the electromechanical transducer 3, and a movable member 5 which is engaged frictionally on the driving member 4 so as to be capable of slidingly displacing.

As shown in FIGS. 2 and 3, the piezoelectric element 3 is formed of a sheet-like piezoelectric layer 6 on which two print electrodes 7, 8 are printed and which is laminated in a axial direction of the driving member 4, and external electrodes 9a, 9b, 10a, 10b which alternately connects the print electrodes 7, 8. In the piezoelectric element 3, an expandable portion 11 in which the print electrodes 7 are interposed expands and contracts in accordance with a voltage applied between the external electrodes 9a-9b, and an expandable portion 12 in which the print electrodes 8 are interposed expands and contracts in accordance with a voltage applied between the external electrodes 10a-10b. That is, the expandable portion 11 and the expandable portion 12 are provided in parallel so as to be capable of separately expanding and contracting in the axial direction of the driving member 4.

Figure 4:
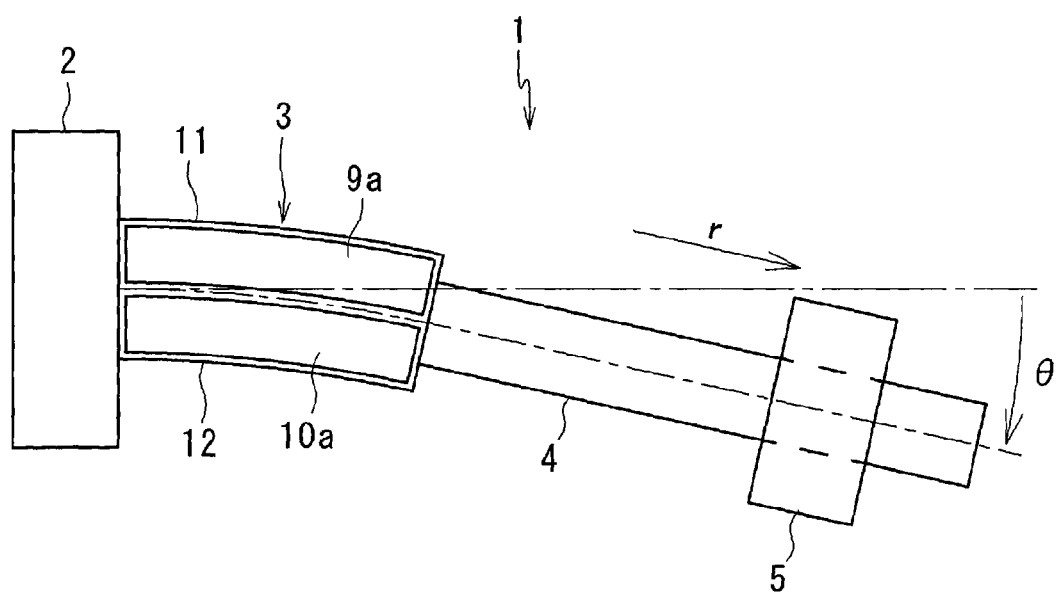
FIG. 4 is a side view of the driving device of FIG. 1 in which a driving member is inclined.

When the expandable portion 11 is expanded by application of a positive voltage between the external electrodes 9a-9b and the expandable portion 12 is contracted by application of a negative voltage between the external electrodes 10a-10b, as shown in FIG. 4, the piezoelectric element 3 curves so that an extremity of the element 3 on a side to which the driving member 4 is fixed tilts in a direction of the expandable portion 12. Thus the driving member 4 is inclined and the movable member 5 is swung to a side of the expandable portion 12.

With application to the external electrodes 9a-9b and 10a-10b short-period alternating voltages which cause slow expansion and subsequent rapid contraction of the expandable portions 11, 12, the movable member 5 slidingly displaces on the driving member 4 in a direction such that the movable member 5 goes away from the piezoelectric element 3.

Thus the driving device 1 is capable of positioning the movable member 5 on a polar coordinate (r, θ), wherein a moving radius r is a position on the driving member 4 and an argument θ is an angle of inclination of the driving member 4.

Figure 5:
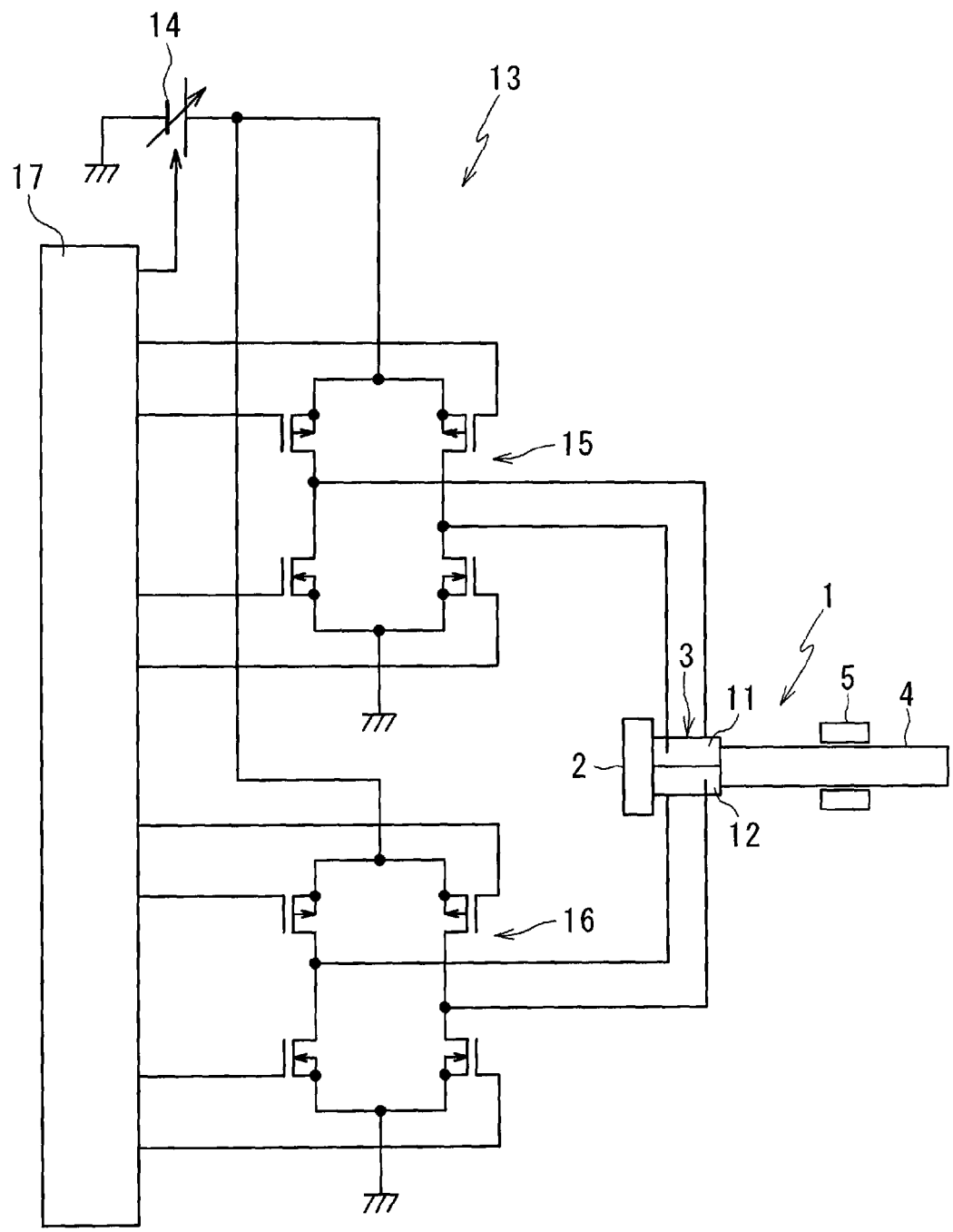
FIG. 5 is a circuit diagram of a drive circuit for the driving device of FIG. 1.

FIG. 5 shows a drive circuit 13 of the driving device 1. The drive circuit 13 has a bridge circuit 15 capable of switching a direct-current power supply 14 and applying a power supply voltage with a desired polarity between the external electrodes 9a-9b and a bridge circuit 16 capable of applying a power supply voltage with a desired polarity between the external electrodes 10a-10b. The bridge circuits 15, 16 are controlled by a control circuit 17 comprised of a microcomputer, and the control circuit 17 is capable of adjusting the power supply voltage of the direct-current power supply 14.

When positioning the movable member 5 of the driving device 1, the control device 17 initially causes the bridge circuits 15, 16 to output alternating voltages with rectangular waves in phase with each other so as to expand and contract the expandable portions 11, 12 of the piezoelectric element 3 in phase with each other and so as to place the movable member 5 with a desired moving radius r with slide displacement thereof. Subsequently, the control device 17 causes the bridge circuits 15, 16 to continue applying the power supply voltages in opposed directions to the expandable portions 11, 12 and adjusts the power supply voltage of the direct-current power supply 14 so as to cause a bend of the piezoelectric element 3 at a desired angle, thereby inclining the driving member 4 at a desired argument θ. Thus the movable member 5 is positioned on the desired polar coordinate (r, θ).

Figure 6:
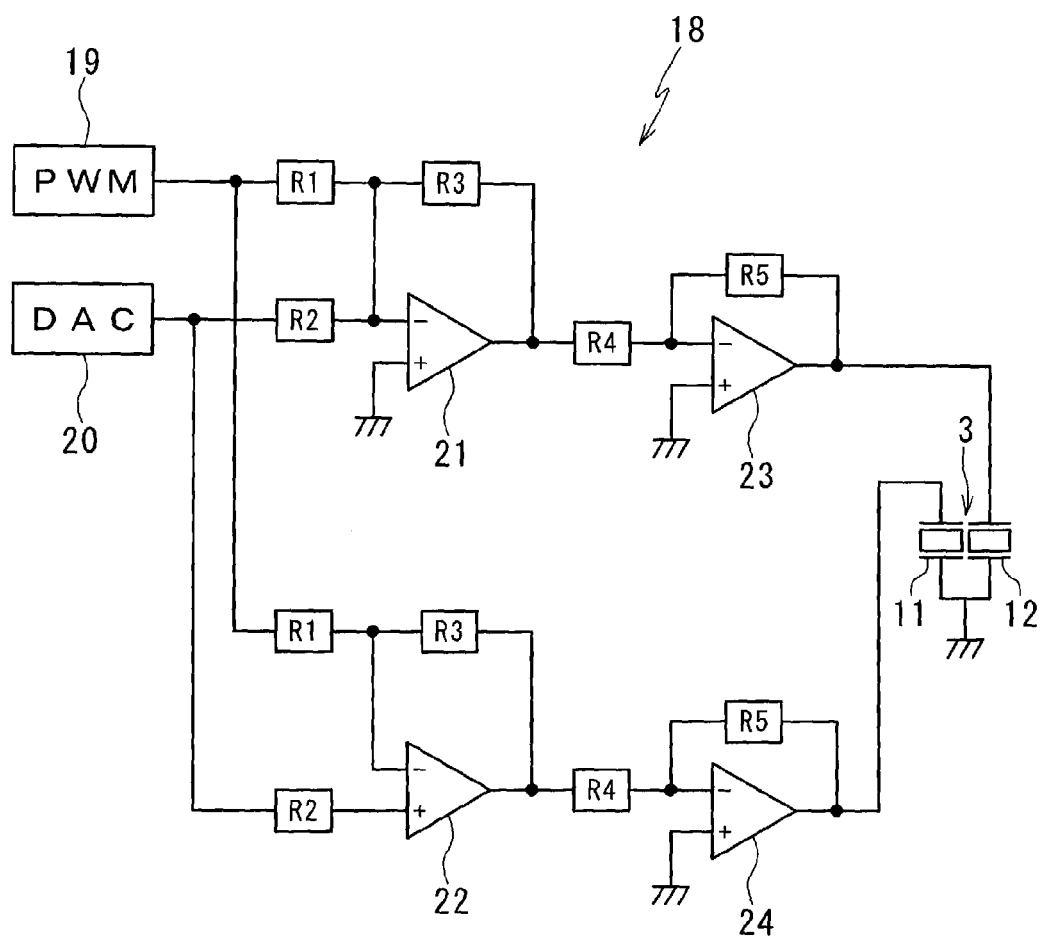
FIG. 6 is a circuit diagram of an alternative drive circuit for the driving device of FIG. 2.

FIG. 6 shows an alternative drive circuit 18 for the driving device 1. The drive circuit 18 has output of a pulse shaper 19 for shaping a waveform of a periodic alternating voltage for causing slide displacement of the movable member 5 relative to the driving member 4 by axial expansion and contraction of the piezoelectric element 3, and a DA converter 20 for producing a voltage signal proportional to a voltage required for bending the piezoelectric element 3 to incline the driving member 4. The pulse shaper 19 and the DA converter 20 are controlled by a microcomputer not shown.

The drive circuit 18 has an adder 21 for adding output of the pulse shaper 19 and output of the DA converter 20 in a specified ratio and amplifying the output with inversion thereof, a subtractor 22 for subtracting the output of the DA converter 20 from the output of the pulse forming device 19 and amplifying the result with inversion thereof, and amplifiers 23, 24 for inverting and amplifying output of the adder 21 and output of the subtractor 22 with the same gains. Output of the amplifiers 23, 24 makes a voltage resulting from superposition of a periodic alternating voltage component obtained from amplification of output waveform of the pulse shaper 19 by a specified amplification factor and a direct-current voltage component obtained from amplification of output waveform of the DA converter 20 by a specified amplification factor. The direct-current voltage component in the amplifier 23 and the direct-current voltage component in the amplifier 24 differ in positiveness/negativeness.

In the drive circuit 18, in which the direct-current voltage component and the alternating voltage component can independently be controlled, the moving radius r of the movable member 5 can be adjusted by the pulse shaper 19 while the argument 0 of the movable member 5 can be adjusted by the DA converter 20.

Figure 7:
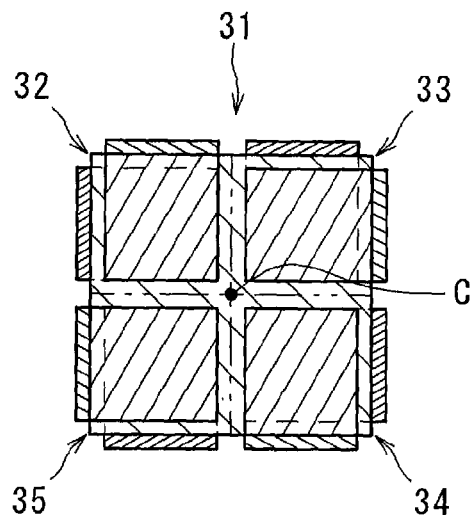
FIG. 7 is a view of a cross-section of a piezoelectric element of a driving device in accordance with a second embodiment of the present invention, taken along a direction perpendicular to an axis thereof.

FIG. 7 shows a cross-section of a piezoelectric element 31 of a driving device 1 in accordance with a second embodiment of the present invention. The following embodiment is the same as the first embodiment except for a configuration of the piezoelectric element 31 and duplicate description is omitted. In the driving device 1 of the present embodiment, the piezoelectric element 31 has four expandable portions 32, 33, 34, 35 which are separately capable of expanding and contracting in a axial direction of a driving member 4 and which are obtained from division of the prism-like piezoelectric element 31 into quarters around a center axis C thereof.

Figure 8:
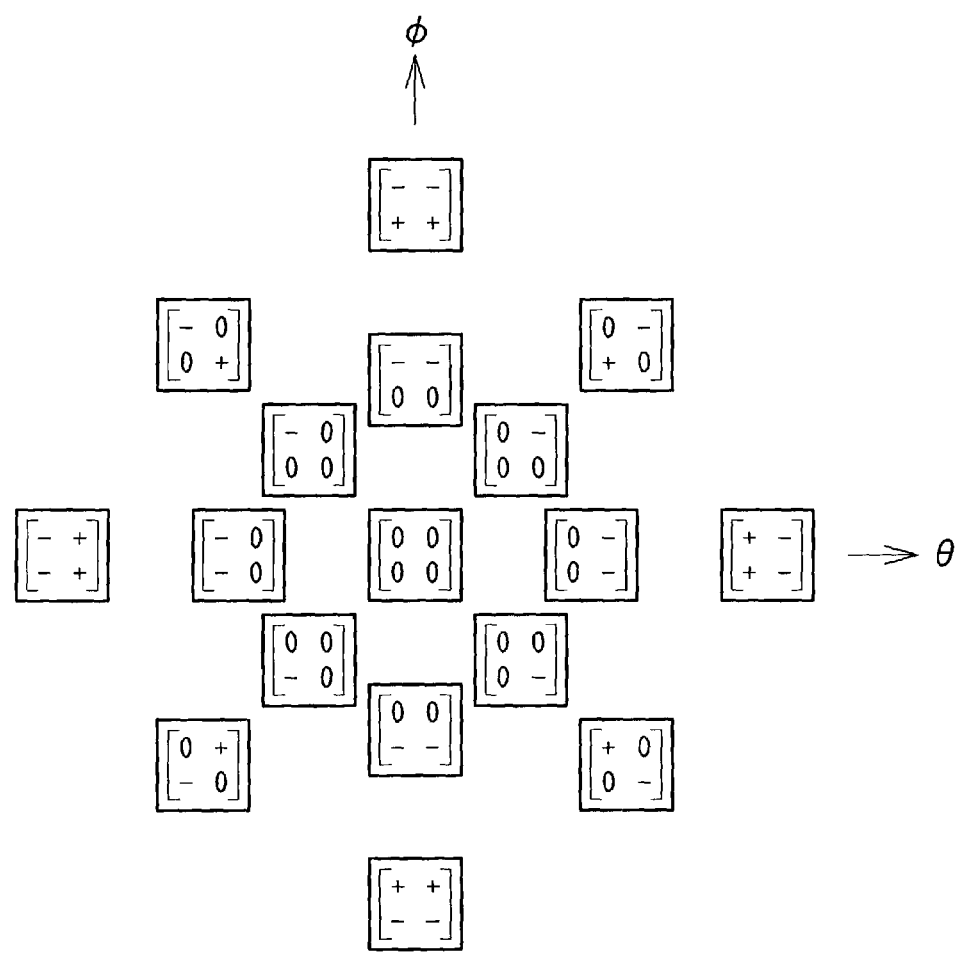
FIG. 8 is a diagram showing positions of an extremity of a driving member of the driving device in accordance with the second embodiment of the present invention.

FIG. 8 shows positions of an extremity of the driving member 4 of the driving device 1 in accordance with the present embodiment, on a plane orthogonal to the axis of the driving member 4. In the present embodiment, a positive or negative power supply voltage or no voltage can be applied separately to each of the expandable portions 32, 33, 34, 35 by bridge circuits (not shown) corresponding to the expandable portions 32, 33, 34, 35, for instance. In the positions of the extremity of the driving member 4 in the drawing, the voltages applied to the expandable portions 32, 33, 34, 35 for obtainment of each of the positions are designated by signs "+", "−", and "0".

In the present embodiment, in this manner, angles ($\theta$, $\phi$) of inclination of the driving member 4 in the two directions can be adjusted. With addition of a position (r) of the movable member 5 on the driving member 4, the driving device 1 is capable of attaining three-dimensional positioning in a spherical coordinate system (r, $\theta$, $\phi$).

In particular, the application of the direct-current voltage opposite in polarity to the expandable portions 32, 33, 34, 35 facing across the center axis C causes great deformation of the piezoelectric element 3 so as to increase an angle of inclination of the driving member 4. Furthermore, the application of no direct-current voltage to some of the expandable portions 32, 34 or 33, 35 increases a number of directions in which the driving member 4 can be inclined.

In the driving device 1 of the present embodiment also, an alternating voltage component may be applied to the expandable portions 32, 33, 34, 35 in common and an adjustable direct-current component voltage may selectively be applied to the desired expandable portions 32, 33, 34 and/or 35. Though the direct-current component voltages may be made separately variable for each of the expandable portions 32, 33, 34, 35, one power supply voltage may be made variable, and only directions (positiveness or negativess) and execution or non-execution of application of the direct-current component voltage may be selected.

Figure 9:
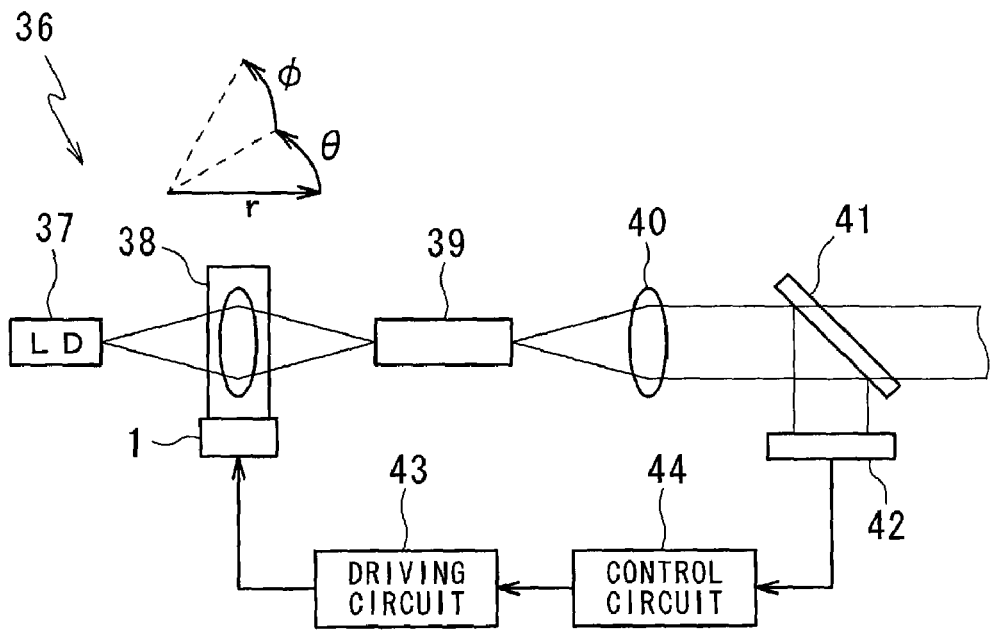
FIG. 9 is a configuration diagram of an optical device using the second embodiment of the present invention.

FIG. 9 shows a laser module 36 using the driving device 1 for the spherical coordinate system, as an example. The laser module 36 has a laser diode 37 for producing an infrared laser beam, an alignment lens 38 which guides the laser beam and is held by the movable member 5 of the driving device 1, a second harmonic generator 39 as a light receiving member for receiving the laser beam and producing a green half-wave laser beam, and an emission lens 40 for emitting output of the second harmonic generator 39. The alignment lens 38 undergoes positioning that is performed by the driving device 1 in a plane orthogonal to an optical axis of the laser beam.

The laser module 36 further has a beam splitter 41 for splitting the output beam from the second harmonic generator 39, a power monitor 42 composed of a sensor such as photodiode for converting an output level of the split output beam from the second harmonic generator 39 into a voltage signal, and a control circuit 44 for controlling operation of a drive circuit 43 for the driving device 1 in response to output of the power monitor 42.

A light receiving portion of the second harmonic generator 39 has an aperture on the order of 1 to 3 μm. The alignment lens 38 condenses the laser beam so that the laser beam has a diameter on the same order as the light receiving portion of the second harmonic generator 39, and aligns the optical axis of the laser beam with a center of the light receiving portion of the second harmonic generator 39. On condition where the laser beam is sufficiently condensed and where the optical axis of the laser beam is aligned with the center of the second harmonic generator 39, all energy of the laser beam is inputted into the second harmonic generator 39, so that output of the second harmonic generator 39 and output of the power monitor 42 are maximized. That is, the driving device 1 performs three-dimensional positioning of the movable member 5 so as to maximize the output of the power monitor 42.

Figure 10:
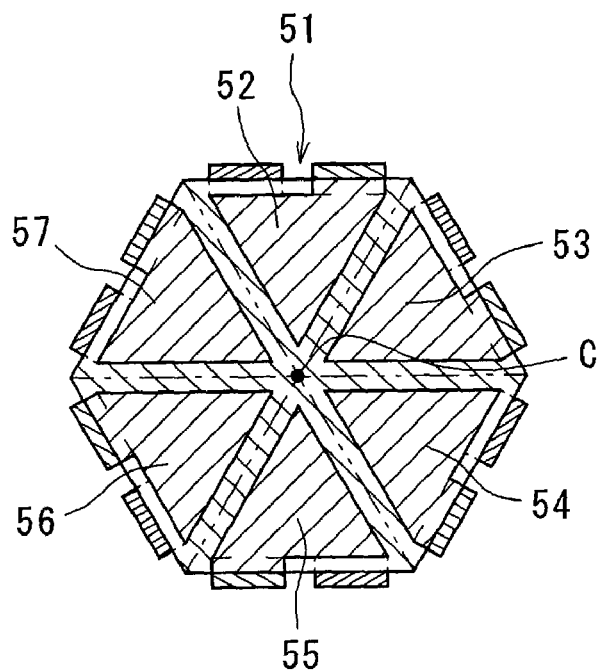
FIG. 10 is a view of a cross-section of a piezoelectric element of a driving device in accordance with a third embodiment of the present invention, taken along a direction perpendicular to an axis thereof.

FIG. 10 shows a piezoelectric element 51 of a driving device 1 in accordance with a third embodiment of the present invention. In the present embodiment, the piezoelectric element 51 is shaped like a hexagonal cylinder and has trigonal-prism-like expandable portions 52, 53, 54, 55, 56, 57 obtained from division thereof into sixths around a center axis C. In the present embodiment, a pair of external electrodes of each of the expandable portions 52, 53, 54, 55, 56, 57 are provided side by side on the same outer surface of the piezoelectric element 51.

As in the present embodiment, increase in number of the expandable portions in parallel in the piezoelectric element allows finer selection of the direction of inclination of the driving member. In a method of selecting the direction of inclination, for instance, there may be selected an asymmetrical pattern of voltage application such as application of a positive voltage to the expandable portions 52, 53, a negative voltage to the expandable portion 54, and no voltage to the expandable portions 55, 56, 57 in the present embodiment.

Even if the number of the expandable portions in parallel is decreased to three, the direction of inclination of the driving member can be selected in a two-dimensional manner, so that three-dimensional positioning of the movable member can be attained.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A driving device comprising:
    a shaft-like driving member;
    an electromechanical transducer having a plurality of expandable transducer portions arranged in a parallel orientation along an axial direction of the driving member, and configured to independently expand and contract in the axial direction of the driving member;
    the shaft-like driving member coupled to one end of the electromechanical transducer,
    a movable member which is frictionally engaged on the driving member, configured to be slidingly displaced along the driving member; and
    wherein each expandable transducer portion is configured to be independently controlled to expand and contract in the axial direction independent of the other expandable transducer portions, so that a difference in an amount of expansion or contraction between respective expandable transducer portions causes curving of the electromechanical transducer and movement of the driving member in a radial direction.

2. The driving device as claimed in claim 1, wherein a number of the expandable portions is not less than three.

3. The driving device as claimed in claim 1, further comprising a drive circuit which applies to some of the expandable portions a direct-current voltage component different from that applied to other expandable portions, and which applies to all the expandable portions a common alternating voltage component periodically fluctuating, wherein the direct-current voltage component can be varied in voltage at a low change rate so as to prevent the slide displacement of the movable member.

4. The driving device as claimed in claim 3, wherein
an even number of the expandable portions are provided around a center axis of the electromechanical transducer which extends in the direction of the axis of the driving member, and wherein
the drive circuit applies the direct-current voltage components opposite in polarity to the expandable portions facing across the center axis.

5. The driving device as claimed in claim 3, wherein
no direct-current voltage component is applied to at least any of the expandable portions.

* * * * *